(12) United States Patent
Ikeda et al.

(10) Patent No.: US 10,438,789 B2
(45) Date of Patent: Oct. 8, 2019

(54) LIGHT SOURCE, LIGHTING DEVICE AND METHOD OF LIGHTING THE SAME

(71) Applicant: PHOENIX ELECTRIC CO., LTD., Himeji-shi, Hyogo (JP)

(72) Inventors: Tomihiko Ikeda, Himeji (JP); Kouichi Odani, Himeji (JP)

(73) Assignee: PHOENIX ELECTRIC CO., LTD., Hyogo (JP)

(*) Notice: Subject to any disclaimer, the term of this patent is extended or adjusted under 35 U.S.C. 154(b) by 0 days.

(21) Appl. No.: 16/110,620

(22) Filed: Aug. 23, 2018

(65) Prior Publication Data

US 2019/0080898 A1 Mar. 14, 2019

(30) Foreign Application Priority Data

Sep. 11, 2017 (JP) .................. 2017-174413

(51) Int. Cl.
| | | |
|---|---|---|
| *H01J 61/52* | (2006.01) | |
| *H01J 61/02* | (2006.01) | |
| *G03F 7/20* | (2006.01) | |
| *H05B 41/36* | (2006.01) | |
| *H01J 61/56* | (2006.01) | |

(52) U.S. Cl.
CPC ........ *H01J 61/523* (2013.01); *G03F 7/70016* (2013.01); *H01J 61/025* (2013.01); *H01J 61/56* (2013.01); *H05B 41/36* (2013.01)

(58) Field of Classification Search
CPC ........ H01J 61/523; H01J 61/56; H01J 61/025; H05B 41/36; G03F 7/70016

USPC ........................................... 315/35
See application file for complete search history.

(56) References Cited

U.S. PATENT DOCUMENTS

| | | | |
|---|---|---|---|
| 2008/0088806 A1 | 4/2008 | Yoshii | |
| 2008/0297062 A1* | 12/2008 | Otake | H05B 33/0815 315/224 |
| 2012/0187863 A1* | 7/2012 | Nonaka | H05B 33/0815 315/291 |
| 2014/0084800 A1* | 3/2014 | Lee | H05B 33/0815 315/200 R |
| 2015/0055944 A1* | 2/2015 | Van Straten | H05B 3/16 392/426 |
| 2016/0205742 A1* | 7/2016 | Seki | H05B 33/0827 315/122 |

FOREIGN PATENT DOCUMENTS

JP 2008098086 A 4/2008

\* cited by examiner

*Primary Examiner* — Don P Le
(74) *Attorney, Agent, or Firm* — Lucas & Mercanti, LLP

(57) ABSTRACT

A light source is composed of a discharge lamp, a resistor and a reflector container. The discharge lamp is provided as a source of light. The resistor increases a resistance in elevation of a temperature thereof, and reduces the resistance in lowering of the temperature thereof. The reflector container is a constituent element to which the discharge lamp and the resistor are attached. Additionally, the resistor is caused to heat an outer surface of the reflector container in accordance with elevation of a temperature of the discharge lamp in activation of lighting of the discharge lamp.

21 Claims, 9 Drawing Sheets

LIGHT SOURCE, LIGHTING DEVICE AND METHOD OF LIGHTING THE SAME

CROSS REFERENCE TO RELATED APPLICATION

This application claims the priority of Japanese Patent Application No. 2017-174413 filed on Sep. 11, 2017, which is incorporated by reference herein.

BACKGROUND OF THE INVENTION

Field of the Invention

The present invention relates to, for instance, a light source emitting rays of light used for exposure of a printed wiring board or so forth, a lighting device using the light source, and a method of activating and deactivating lighting of the light source.

Background Art

A type of printed wiring board has a structure that a wiring pattern, made of metal such as copper, is formed on a substrate made of resin or glass epoxy material, and has been conventionally used for mounting of components to an electronic device. Technique of photoetching has been used for forming the wiring pattern on the printed wiring board. Photoetching is executed by preparing a substrate that a metal layer is disposed as a prospective wiring on the entire surface thereof; applying a light-sensitive chemical agent as a photoresist to the entire surface of the substrate; and irradiating the photoresist with rays of light from an exposure device through a photomask having the same shape as the wiring pattern.

There are two types of photoresist. One is a negative photoresist, and is reduced in solubility by rays of light irradiated thereto. The other is a positive photoresist, and contrarily to the negative photoresist, is increased in solubility by rays of light irradiated thereto. Part of the photoresist is relatively increased in solubility by rays of light irradiated thereto, and is removed by chemical processing. Part of the metal layer is thus exposed and is then removed by etching. Accordingly, only part of the metal layer, disposed under the remaining part of the photoresist, is left unetched. Finally, the remaining part of the photoresist is removed. In this way, a wiring pattern is formed on the substrate. In irradiating a photoresist with rays of light, regardless of whether the photoresist is of a positive type or a negative type, the rays of light are required to be irradiated stably at homogeneous illuminance for a predetermined period of time in order to reliably expose the entirety of the irradiated surface of the photoresist with a homogeneous exposed amount.

Thus, a light source requires a function of controlling the irradiation angle of rays of light to be released therefrom, irradiation distribution and so forth, for instance, when used as a source of the light in a lighting device that encompasses the exposure device as a representative example. Because of this, the light source is not formed by a single source of the light (e.g., a discharge lamp), but is formed by a combination of the source of the light and a reflector including a light reflective surface (e.g., Japan Laid-open Patent Application Publication No. 2008-98086).

SUMMARY OF THE INVENTION

However, there have been chances of producing a drawback when a source of the light such as a discharge lamp, the temperature of which gets higher during light emission, is used in the aforementioned light source. Specifically, when lighting of the discharge lamp of the light source is activated from a cold state, the inner surface (reflective surface) of the reflector directly receives radiant heat from the discharge lamp, and the surface temperature thereon is abruptly elevated. By contrast, elevation in surface temperature on the outer surface of the reflector is inevitably delayed than elevation in surface temperature on the inner surface of the reflector.

Especially, when a base member (made of, e.g., ceramic) is attached to the bottom outer side of the reflector such that the reflector and the discharge lamp hold each other at a predetermined position, the base member is supposed to play a role of a heat dissipation member, whereby difference in surface temperature further increases between the bottom outer side of the reflector and the inner surface of the reflector in a predetermined period of time from activation of lighting of the discharge lamp. Therefore, there has been a risk of producing "a crack" on the reflector due to difference in surface temperature between the inner surface and the bottom outer side of the reflector.

Furthermore, a similar drawback has been also produced when lighting of the discharge lamp of the light source is deactivated in a state that lighting of the discharge lamp has been continued for a certain period of time (i.e., a warm state). Specifically, immediately after deactivation of lighting of the discharge lamp, the surface temperature on the inner surface of the reflector gets lowered relatively slowly by residual heat from the discharge lamp. By contrast, the surface temperature on the outer surface of the reflector (especially, the bottom outer side of the reflector to which the base member is attached) gets lowered abruptly. Therefore, there has been also a risk of producing "a crack" on the reflector in deactivation of lighting of the discharge lamp.

The present invention has been produced in view of the aforementioned drawback. It is an object of the present invention to provide a light source, which includes a source of light (a discharge lamp) and a reflector container (a reflector and a base member) and is capable of minimizing a possibility of producing "a crack" on the reflector in activation of lighting of the discharge lamp and in deactivation of lighting of the discharge lamp; a lighting device including the light source; and a method of activating and deactivating lighting of the light source.

According to an aspect of the present invention, a light source is provided that includes a discharge lamp, a resistor and a reflector container. The discharge lamp is provided as a source of light. The resistor increases a resistance in elevation of a temperature thereof, and reduces the resistance in lowering of the temperature thereof. The reflector container is a constituent element to which the discharge lamp and the resistor are attached. Additionally, the resistor gradually reduces heat applied to the reflector container in accordance with elevation of a temperature of the discharge lamp in activation of lighting of the discharge lamp.

Moreover, according to another aspect of the present invention, a light source is provided that includes a discharge lamp, a resistor and a reflector container. The discharge lamp is provided as a source of light. The resistor increases a resistance in elevation of a temperature thereof, and reduces the resistance in lowering of the temperature thereof. The reflector container is a constituent element to which the discharge lamp and the resistor are attached. Additionally, the resistor gradually increases heat applied to the reflector container in accordance with lowering of a temperature of the discharge lamp in deactivation of lighting of the discharge lamp.

It is preferable that the discharge lamp mainly irradiates an ultraviolet light, and the reflector container includes a reflective surface by which the ultraviolet light irradiated from the discharge lamp is reflected.

It is preferable that the resistor is accommodated in the reflector container.

Furthermore, according to another aspect of the present invention, a lighting device is provided that includes at least one light source each configured as described above, and a constant voltage power source supplying constant voltage to the resistor.

Furthermore, according to another aspect of the present invention, a lighting device is provided that includes at least one light source each configured as described above, and a constant electric current power source supplying constant electric current to the resistor.

Furthermore, according to another aspect of the present invention, a lighting device is provided that includes at least one light source each configured as described above, a constant voltage power source supplying constant voltage to the resistor in a phase to activate lighting of the discharge lamp, and a constant electric current power source supplying constant electric current to the resistor in a phase to deactivate lighting of the discharge lamp.

Incidentally, according to yet another aspect of the present invention, a method of lighting a light source is provided. The method includes supplying constant voltage to the resistor for a predetermined period of time after activation of lighting of the discharge lamp in the light source. The light source is the one configured as described above.

Moreover, according to yet another aspect of the present invention, a method of lighting a light source is provided. The method includes supplying constant electric current to the resistor for a predetermined period of time after activation of lighting of the discharge lamp in the light source. The light source is the one configured as described above.

Furthermore, according to yet another aspect of the present invention, a method of lighting a light source is provided. The method includes supplying constant voltage to the resistor for a predetermined period of time after deactivation of lighting of the discharge lamp in the light source. The light source is the one configured as described above.

Furthermore, according to yet another aspect of the present invention, a method of lighting a light source is provided. The method includes supplying constant electric current to the resistor for a predetermined period of time after deactivation of lighting of the discharge lamp in the light source. The light source is the one configured described above.

Furthermore, according to yet another aspect of the present invention, a method of lighting a light source is provided. The method includes: supplying constant voltage to the resistor for a predetermined period of time after activation of lighting of the discharge lamp in the light source; and supplying constant electric current to the resistor for a predetermined period of time after deactivation of lighting of the discharge lamp in the light source. The light source is the one configured as described above.

Advantageous Effects of Invention

According to the present invention, it is possible to provide: a light source that includes a source of light (a discharge lamp) and a reflector container and is capable of minimizing a possibility of producing "a crack" on a reflector in activation or deactivation of lighting of the discharge lamp; a lighting device including the light source; and a method of activating and deactivating lighting of the light source.

BRIEF DESCRIPTION OF THE DRAWINGS

Referring now to the attached drawings which form a part of this original disclosure.

DETAILED DESCRIPTION OF EMBODIMENTS

Practical Example 1

In a practical example 1, explanation will be made regarding an exemplary configuration that a lighting device 50, to which the present invention is applied, is used for an exposure machine 10 for exposing a printed wiring board or so forth to light. Obviously, the lighting device 50 is usable not only for the exposure machine 10 but also for other illumination applications. Additionally, the wavelength of a ray of light irradiated from a light source 100 is also selected in accordance with illumination applications.

(Configuration of Exposure Machine 10)

Figure 1:
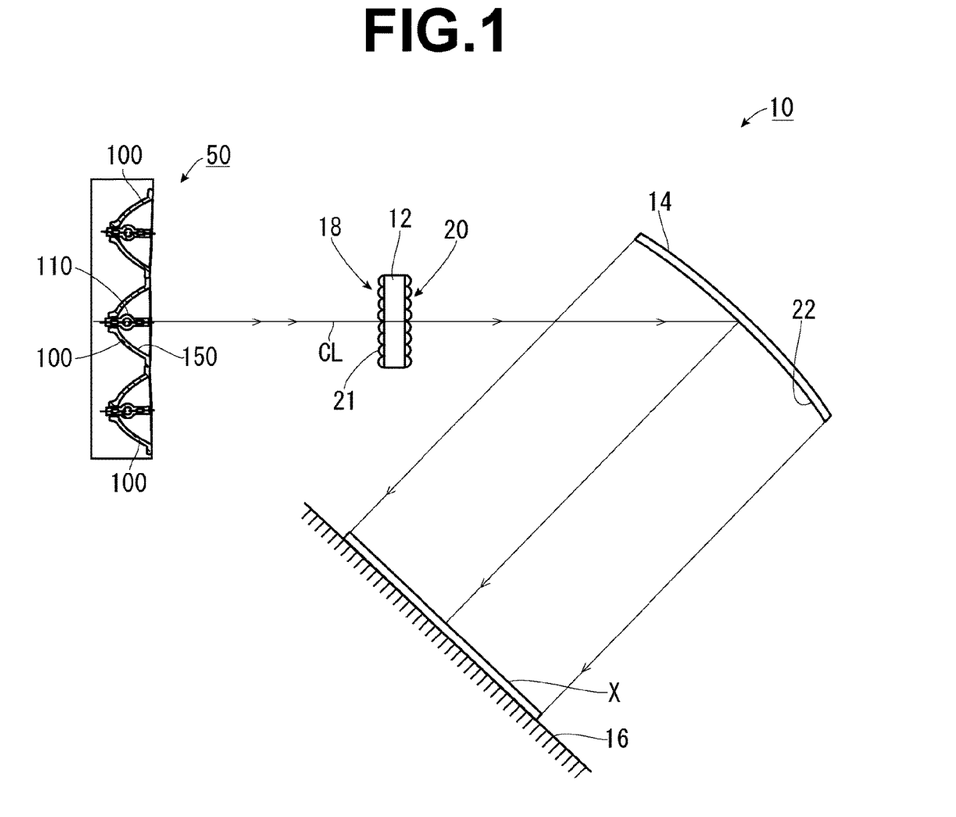
FIG. 1 is an exemplary exposure machine (10) to which the present invention is applied.

FIG. 1 shows the exposure machine 10 according to the practical example 1 to which the present invention is applied. The exposure machine 10 is mainly composed of the lighting device 50, an integrator 12, a concave mirror 14 and an irradiated surface 16.

The lighting device 50 irradiates rays of light with a wavelength suitable for exposure of an exposed object X. The lighting device 50 will be explained in detail after explanation of the configuration of the exposure machine 10.

The integrator 12 includes an incident surface 18 and an emission surface 20. Rays of light, irradiated from the lighting device 50, are received by the incident surface 18. The received rays of light are emitted from the emission surface 20, while being enhanced in homogeneity therethrough. Each of the incident surface 18 and the emission surface 20 is provided with a plurality of fly-eye lenses 21.

The concave mirror 14 includes a reflective concave surface 22 on the inner side thereof. The concave mirror 14 changes the rays of light emitted from the integrator 12 into the form of parallel rays by reflecting the rays of light at the reflective concave surface 22.

The irradiated surface 16 is a surface by which the parallel rays from the concave mirror 14 are received. The irradiated surface 16 is disposed to face approximately orthogonally to the parallel rays. The exposed object X is mounted to the irradiated surface 16. A photosensitive agent, for instance, is applied to the surface of the exposed object X. When a desired region of the exposed object X is irradiated by the parallel rays from the concave mirror 14, a desired circuit pattern or so forth is formed on the surface of the exposed object X.

(Configuration of Lighting Device 50)

Figure 2:
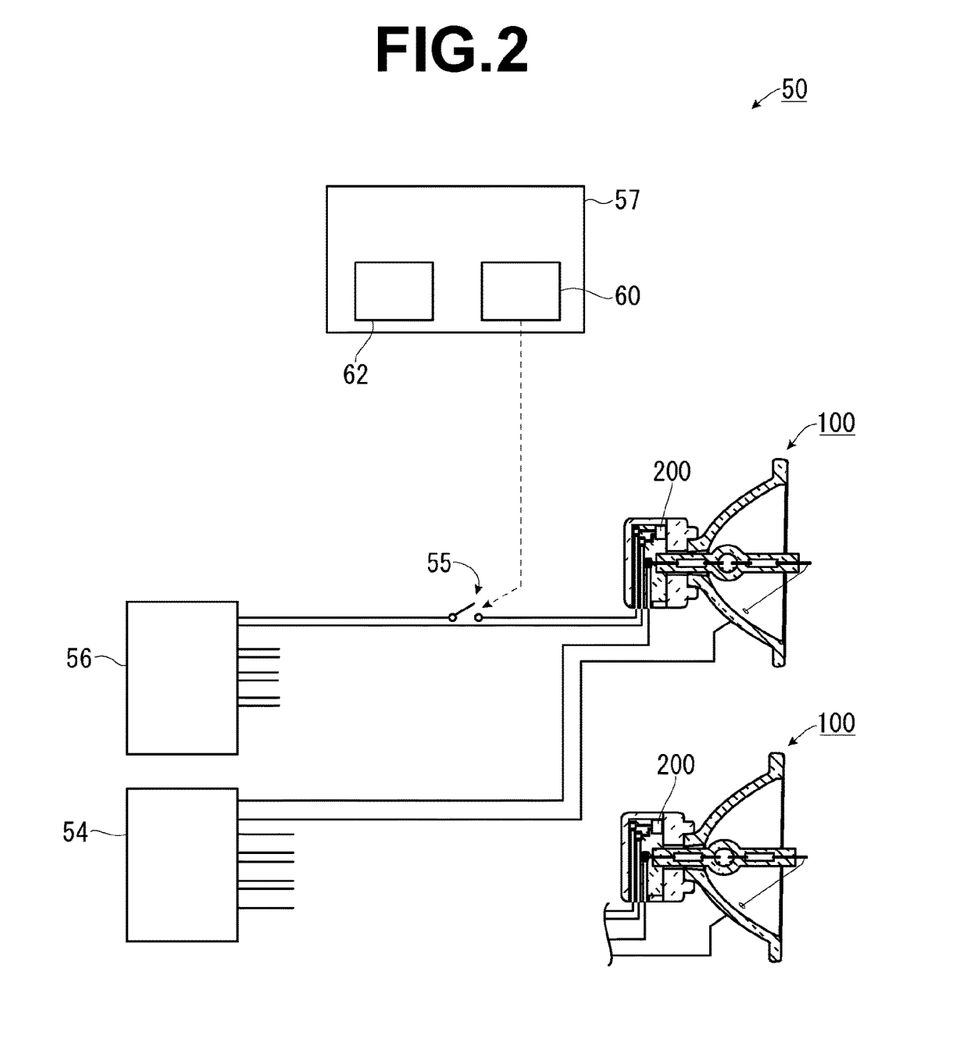
FIG. 2 is an exemplary lighting device (50) to which the present invention is applied.
Figure 3:
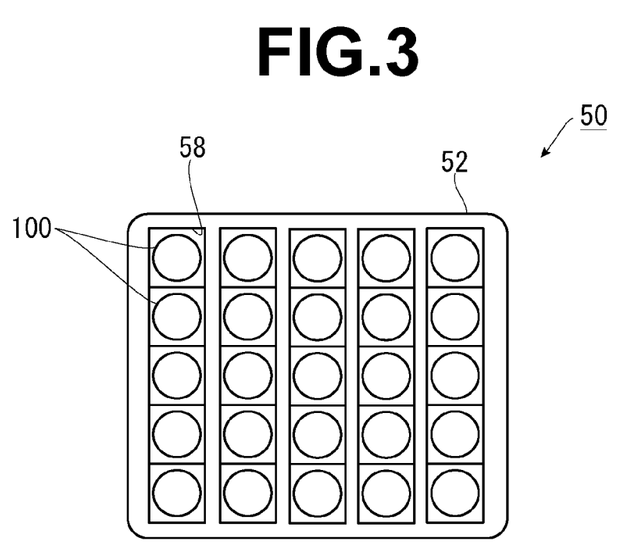
FIG. 3 is a plan view of the exemplary lighting device (50) to which the present invention is applied.

FIG. 2 is a diagram showing the lighting device 50 according to the practical example 1 to which the present invention is applied. Additionally, FIG. 3 is a plan view of the lighting device 50. The lighting device 50 includes a plurality of light source 100, a frame 52, a lighting circuit 54, a switch 55, a constant voltage power source 56 and a constant voltage supply control device 57.

Figure 4:
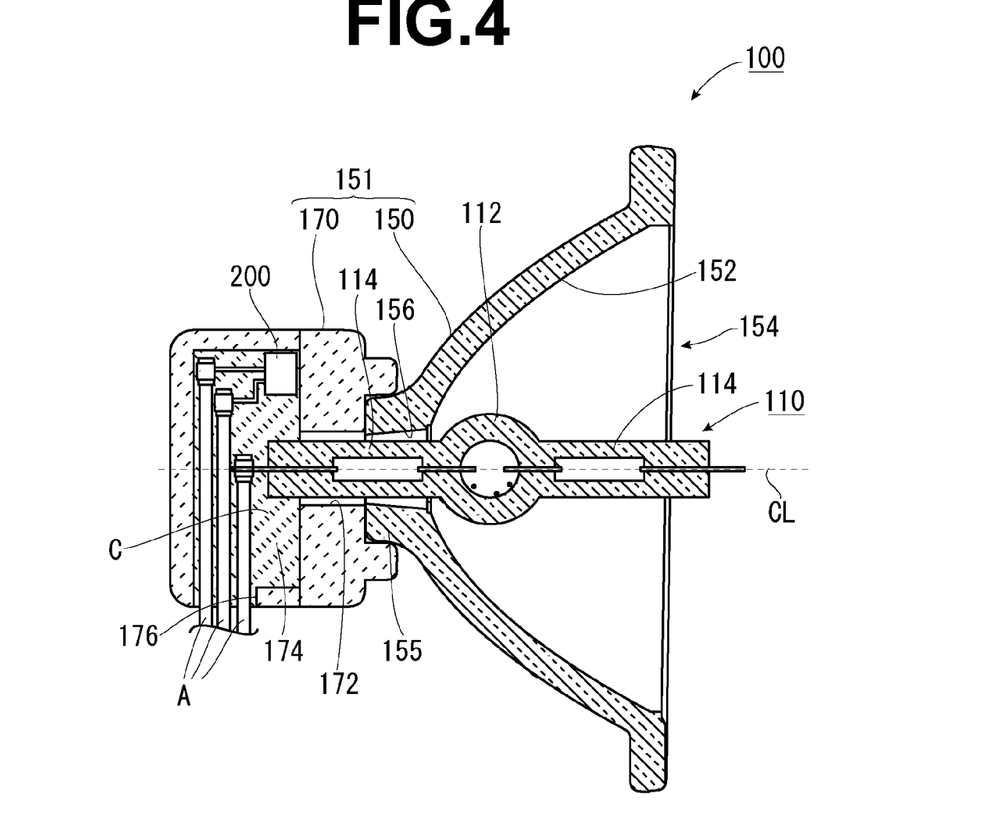
FIG. 4 is a cross-sectional view of an exemplary light source (100) to which the present invention is applied.

Each light source 100 irradiates rays of light including rays of ultraviolet light with a wavelength suitable for exposure of the exposed object X. As shown in FIG. 4, each light source 100 is mainly composed of a discharge lamp 110, a reflector 150, an insulating base 170 and a resistor 200. It should be noted that the reflector 150 and the insulating base 170 will be collectively referred to as a reflector container 151 on an as-needed basis.

Figure 5:
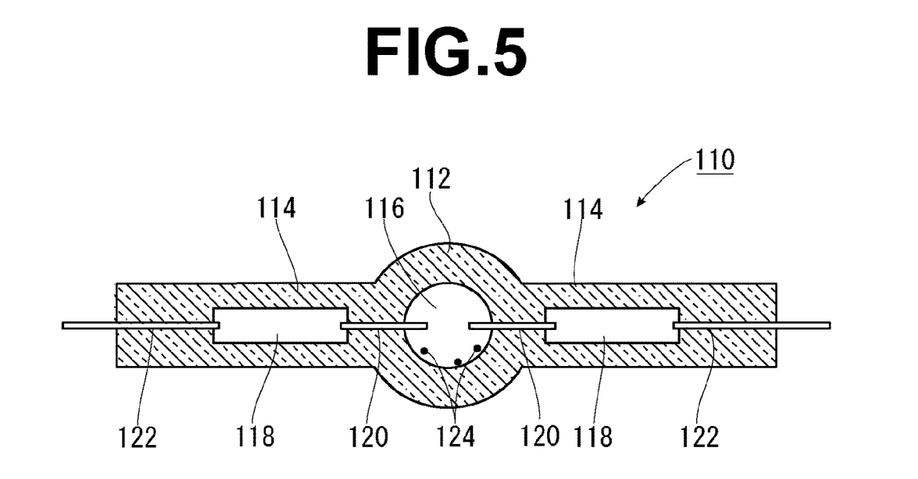
FIG. 5 is a cross-sectional view of an exemplary discharge lamp (110)

As shown in FIG. 5, the discharge lamp 110 includes a luminous tube portion 112 and a pair of sealed portions 114 extending from the luminous tube portion 112. The luminous tube portion 112 and the pair of sealed portions 114 are integrally made of silica glass. Moreover, an internal space 116 is formed in the luminous tube portion 112, and is sealed by the sealed portions 114.

The discharge lamp 110 includes a pair of foils 108, a pair of electrodes 120 and a pair of lead rods 122 in the pair of sealed portions 114. The pair of foils 118 is made of molybdenum, and is embedded in the pair of sealed portions 114, respectively. The pair of electrodes 120 is made of tungsten. One end of each electrode 120 is connected to one end of each foil 118, whereas the other end thereof is disposed inside the internal space 116. One end of each lead rod 122 is connected to the other end of each foil 118, whereas the other end thereof extends to the outside from each sealed portion 114. Additionally, a predetermined amount of mercury 124 and a predetermined amount of halogen (e.g., bromine) are encapsulated in the internal space 116.

When predetermined high voltage is applied to the pair of lead rods 122 mounted to the discharge lamp 110, a glow discharge starts between the pair of electrodes 120 mounted to the internal space 116 of the luminous tube portion 112. Afterwards, the glow discharge transitions to an arc discharge. The mercury 124 is evaporated and excited by the arc and emits rays of light (mainly rays of ultraviolet light).

Referring back to FIG. 4, in each light source 100 according to the present practical example, one of the pair of sealed portions 114 is inserted and mounted into a sealed portion inserted-and-mounted hole 156 of the reflector 150. It should be noted that the discharge lamp 110 may be used for AC (alternating current) lighting, or alternatively, may be used for DC (direct current) lighting.

The reflector 150 includes a reflective surface 152 having a bowl shape on the inner surface thereof. The reflective surface 152 reflects part of rays of light emitted from the discharge lamp 110 disposed such that the luminous tube portion 112 is located inside the reflector 150. In the present practical example, the reflective surface 152 is defined by a paraboloid of revolution. Additionally, an emission point in the discharge lamp 110 (roughly a middle position of the arc formed between the pair of electrodes 120 in the internal space 116) is matched with the focal point of the paraboloid of revolution. Accordingly, rays of light, irradiated from the emission point of the discharge lamp 110, are reflected by the reflective surface 152, and are then outputted from an opening 154 of the reflector 150 in the form of approximately parallel rays. It is obvious that the reflective surface 152 is not limited to be made in the aforementioned shape, and may be made in the shape of any other ellipsoid of revolution, any other surface of revolution, or any other surface excluding the surface of revolution. In addition, the emission point is not necessarily required to be matched with the focal point, and may be displaced from the focal point on an as-needed basis.

Moreover, the reflector 150 includes a bottom neck 155 protruding from the opposite side of the opening 154. Furthermore, the reflector 150 is provided with the sealed portion inserted-and-mounted hole 156 in the reflective surface 152. One of the pair of sealed portions 114 in the discharge lamp 110 is inserted and mounted into the sealed portion inserted-and-mounted hole 156. The sealed portion inserted-and-mounted hole 156 is bored from the bottom of the reflective surface 152 to the distal end of the bottom neck 155.

As shown in FIG. 1, combining the reflector 150 to the discharge lamp 110 makes the rays of light, irradiated from the discharge lamp 110, travel ahead of the reflector 150 within a range spreading about a ray of light traveling along a center axis CL of the reflective surface 152 at a predetermined angle (divergence angle).

Referring back to FIG. 4, the insulating base 170 is made of electric insulator such as ceramic, and is provided with a reflector insertion hole 172. The bottom neck 155 of the reflector 150 and one of the pair of sealed portions 114 in the discharge lamp 110, which is inserted and mounted to the sealed portion inserted-and-mounted hole 156, are inserted into the reflector insertion hole 172. The insulating base 170 is configured to cover the sealed portion inserted-and-mounted hole 156 from outside because of the structure that the bottom neck 155 and one of the pair of sealed portions 114 are inserted into the reflector insertion hole 172.

Additionally, the insulating base 170 is provided with an internal space 174 that communicates with the aforementioned reflector insertion hole 172. Moreover, the insulating base 170 is provided with a power source cable inserted-through hole 176 that the internal space 174 and the outside communicate therethrough and that power source cables A are inserted therethrough.

Furthermore, the insulating base 170 and the discharge lamp 110 (the resistor 200 as well in the present practical example) are fixed to each other by an inorganic adhesive C having electric insulating properties and high thermal conductivity. This will be specifically explained. The end of the bottom neck 155 of the reflector 150 and one of the pair of sealed portions 114 in the discharge lamp 110 are inserted into the reflector insertion hole 172 of the insulating base 170. Moreover, while the resistor 200 and the power source cables A are disposed in the internal space 174 of the insulating base 170, the internal space 174 is filled up with the inorganic adhesive C.

The resistor 200 has characteristics of sensing the temperature thereof, increasing resistance in elevation of the temperature, and reducing resistance in lowering of the temperature. Specifically, a PTC thermistor or so forth is used as the resistor 200. It should be noted that as shown in FIG. 4, it is preferable and suitable for the resistor 200 to be attached to the following position or the vicinity thereof, i.e., the position located above the bottom neck 155 of the reflector 150 (i.e., on the upper side of the bottom neck 155 in FIG. 4) in use of the lighting device 50 to which each light source 100 is attached. This is because in the position, the temperature on the inner surface of the reflector 150 is likely to be quite high, and difference in temperature between the inner surface and the outer surface of the reflector 150 is likely to be the largest.

Referring back to FIG. 3, the frame 52 is a member made in the shape of an approximately cuboid provided with a plurality of recesses 58 to which the plurality of light source 100 are attached.

Referring back to FIG. 2, the lighting circuit 54 is a circuit for supplying required electric power to the discharge lamp 110 in each light source 100 attached to the frame 52. Additionally, the constant voltage power source 56 is a power source for supplying DC constant voltage to the resistor 200 in each light source 100. The switch 55 turns on and off the supply of the DC constant voltage to the resistor 200 in each light source 100. It should be noted that the constant voltage herein supplied may be AC constant voltage.

Figure 6:
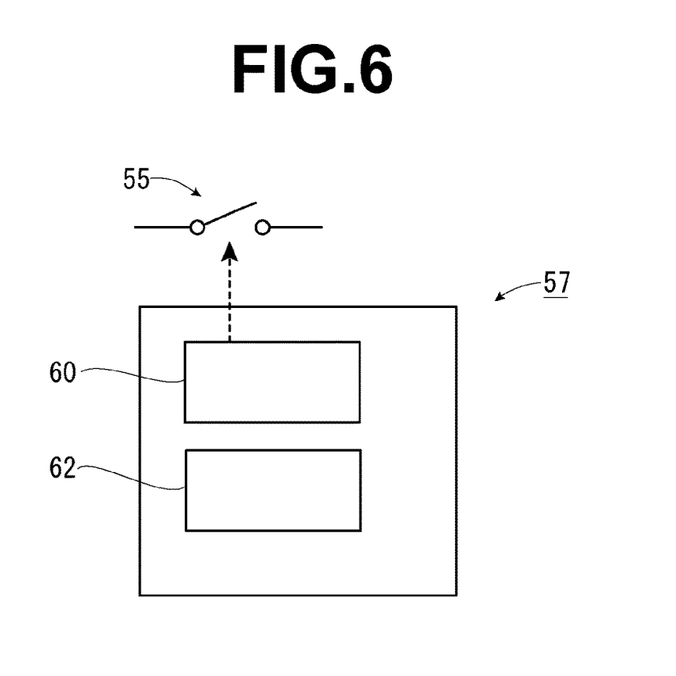
FIG. 6 is a diagram showing an exemplary constant voltage supply control device (57) to which the present invention is applied.

The constant voltage supply control device 57 is a device for controlling (turning on and off) the supply of constant voltage to the resistor 200 in each light source 100. As shown in FIG. 6, the constant voltage supply control device 57 mainly includes a controller 60 and a timer 62.

The controller 60 has a function of turning on and off the supply of voltage to the resistor 200 from the constant voltage power source 56 by operating the switch 55.

The timer 62 has a function of notifying the controller 60 that a predetermined period of time has elapsed since turning on of the switch 55 by the controller 60 at predetermined timing after the elapse of the predetermined period of time.

(Action of Lighting Device 50)

When a power source switch (not shown in the drawings) of the lighting device 50 is turned on, the lighting circuit 54 supplies electric power to the discharge lamps 110 in all the light sources 100 attached to the frame 52. Normally, it takes several minutes for completely activating the discharge lamps 110.

Immediately after turning on the power source switch of the lighting device 50, the controller 60 in the constant voltage supply control device 57 also supplies constant voltage to the resistor 200 in each light source 100 from the constant voltage power source 56 by turning on the switch 55 connected to the resistor 200 in each light source 100. Obviously, the timing, at which the constant voltage supply control device 57 operates, is not limited to the above, and may come simultaneously with supplying electric power to each discharge lamp 110 by the lighting circuit 54, or alternatively, may come in advance of or after starting the supply of electric power to each discharge lamp 110.

Even when the constant voltage supply control device 57 starts supplying constant voltage to the resistor 200 in each light source 100, the temperature of the resistor 200 is about room temperature and is thus low, because the amount of heat irradiated from the discharge lamp 110 in each light source 100 is small immediately after starting of light emission by the discharge lamp 110. Because of this, the resistance of the resistor 200 is small, and hence, a relatively large amount of electric current flows through the resistor 200 to which constant voltage is supplied. Such a large amount of electric current flowing through the resistor 200 results in abrupt elevation in temperature of the resistor 200. Accordingly, the surface temperature on the outer surface of the reflector 150 (especially, the bottom neck 155) elevates.

After a while since lighting of the discharge lamp 110, the amount of heat irradiated from the discharge lamp 110 increases. This results in abrupt elevation of the surface temperature on the inner surface (the reflective surface 152) of the reflector 150. The temperature of the resistor 200 further gets higher due to the heat irradiated from the discharge lamp 110. Accordingly, the resistance of the resistor 200 also gets larger. When the resistor 200 gets larger in resistance, electric current, flowing through the resistor 200 to which constant voltage is supplied, gets smaller in amount, and the amount of heat irradiated from the resistor 200 gets smaller.

"A timer time in activation of lighting" has been preliminarily set in the timer 62 in the constant voltage supply control device 57 as a period of time required until the temperature of the resistor 200 becomes sufficiently high whereby the amount of electric current flowing through the resistor 200 reduces. The timer 62 notifies the controller 60 of elapse of the predetermined period of time at predetermined timing. When notified of the above from the timer 62, the controller 60 stops the supply of constant voltage to the resistor 200 by turning off the switch 55.

Figure 7:
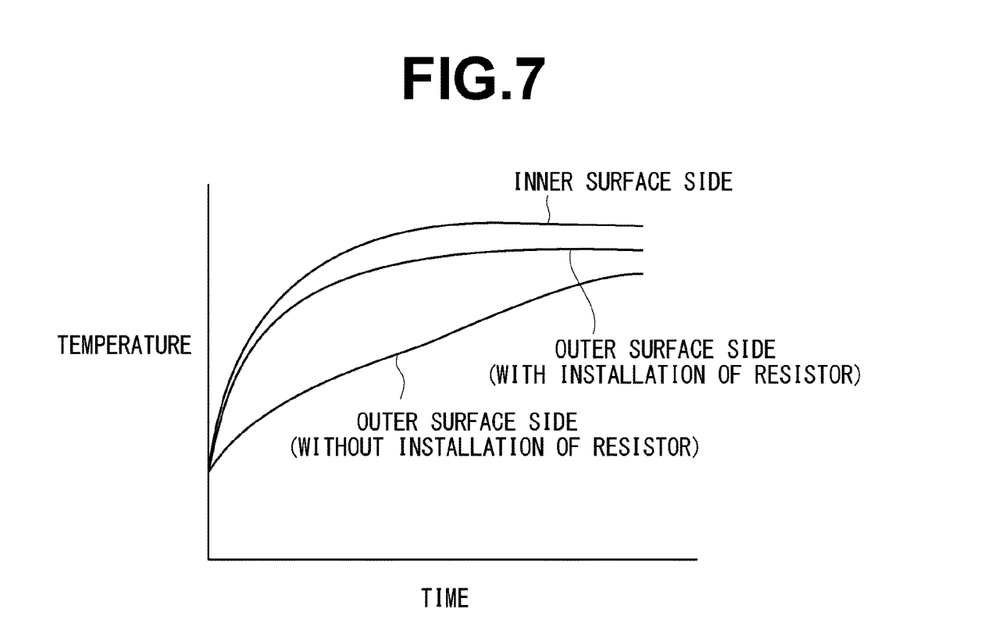
FIG. 7 is a chart showing exemplary behaviors regarding the surface temperature on the inner surface of a reflector (150), that on the outer surface of the reflector (150) with installation of a resistor (200) and that on the outer surface of the reflector (150) without installation of the resistor (200) in a condition where constant voltage is supplied in activation of lighting of the discharge lamp 110.

The aforementioned operation of the constant voltage supply control device 57 results in, as shown in FIG. 7, behaviors regarding the surface temperature on the inner surface of the reflector 150, that on the outer surface of the reflector 150 with installation of the resistor 200, and that on the outer surface of the reflector 150 without installation of the resistor 200.

Immediately after activation of lighting of the discharge lamp 110, the inner surface of the reflector 150 receives heat from the discharge lamp 110 whereby the surface temperature on the inner surface of the reflector 150 abruptly elevates.

By contrast, without installation of the resistor 200, the surface temperature on the outer surface of the reflector 150 quite slowly elevates in comparison with that on the inner surface of the reflector 150. Without installation of the resistor 200, the surface temperature on the inner surface of the reflector 150 is still low even when approximately fully elevating. Because of this, large difference in surface temperature is inevitable between the inner surface and the outer surface. Hence, there is a risk of producing "a crack" on the reflector 150.

However, each light source 100 according to the present practical example includes the resistor 200, and constant voltage is supplied to the resistor 200 along with supplying electric power to the discharge lamp 110. Hence, the surface temperature on the outer surface of the reflector 150 also quickly elevates. Because of this, it is possible to avoid difference in surface temperature from being enlarged between the inner surface and the outer surface, and also, to minimize a possibility of producing "a crack" on the reflector 150.

Next, deactivation of lighting of each discharge lamp 110 will be explained. When electric power is stopped from being supplied to the discharge lamp 110 in each light source 100 from the lighting circuit 54, the controller 60 in the constant voltage supply control device 57 supplies constant voltage to the resistor 200 in each light source 100 from the constant voltage power source 56 by turning on the switch 55 connected to the resistor 200. The timing at which the constant voltage supply control device 57 operates is not limited to the above. When a user instructs the lighting device 50 to deactivate lighting of each discharge lamp 110, the controller 60 in the constant voltage supply control device 57 may firstly start supplying constant voltage to the resistor 200 in each light source 100, and electric power may be then stopped from being supplied to each discharge lamp 110 from the lighting circuit 54 in this order.

When lighting of the discharge lamp 110 is deactivated, the amount of heat irradiated from the discharge lamp 110 gets smaller. At this time, the inner surface of the reflector 150 receives residual heat from the discharge lamp 110. Hence, the surface temperature on the inner surface of the reflector 150 gently gets lower. However, the outer surface of the reflector 150 is unlikely to receive the residual heat from the discharge lamp 110. Hence, the surface temperature on the outer surface of the reflector 150 abruptly gets lower.

By contrast, when the constant voltage supply control device 57 starts supplying constant voltage to the resistor 200 in each light source 100, the temperature of the resistor 200 will have been highly elevated due to the heat from the discharge lamp 110 that will have been lit until then. Because of this, the resistance of the resistor 200 will have become large, and a small amount of electric current flows through the resistor 200 to which constant voltage is supplied. Hence, the amount of heat irradiated from the resistor 200 is mall.

However, when the resistor 200, which is unlikely to receive the heat from the discharge lamp 110, gets lower in temperature, the resistor 200 gets smaller in resistance. Electric current, flowing through the resistor 200 to which constant voltage is supplied, gets larger in amount. Hence, the amount of heat irradiated from the resistor 200 also gets larger.

"A timer time in deactivation of lighting" has been preliminarily set in the timer 62 in the constant voltage supply control device 57 as a period of time required until the surface temperature on the inner surface of the reflector 150 becomes sufficiently low whereby it becomes no longer necessary for the surface temperature on the outer surface of the reflector 150 to be elevated by the heat irradiated from the resistor 200. The timer 62 notifies the controller 60 of elapse of the predetermined period of time at predetermined timing. When notified of the above from the timer 62, the controller 60 stops constant voltage from being supplied to the resistor 200 by turning off the switch 55.

Figure 8:
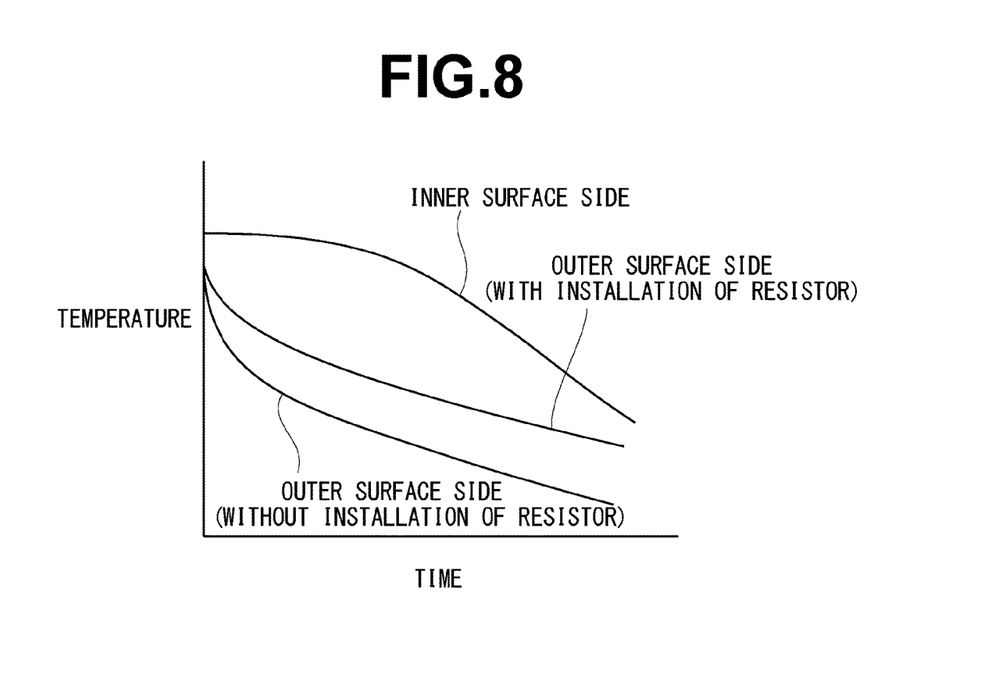
FIG. 8 is a chart showing exemplary behaviors regarding the surface temperature on the inner surface of the reflector (150), that on the outer surface of the reflector (150) with installation of the resistor (200) and that on the outer surface of the reflector (150) without installation of the resistor (200) in a condition where constant voltage is supplied in deactivation of lighting of the discharge lamp 110.

The aforementioned operation of the constant voltage supply control device 57 results in, as shown in FIG. 8, behaviors regarding the surface temperature on the inner surface of the reflector 150, that on the outer surface of the reflector 150 with installation of the resistor 200, and that on the outer surface of the reflector 150 without installation of the resistor 200.

Even in deactivation of lighting of the discharge lamp 110, the inner surface of the reflector 150 receives the residual heat from the discharge lamp 110. Hence, the surface temperature on the inner surface of the reflector 150 gently gets lower.

By contrast, the outer surface of the reflector 150 is unlikely to receive the residual heat from the discharge lamp 110. Hence, without installation of the resistor 200, the surface temperature on the outer surface of the reflector 150 abruptly gets lower than that on the inner surface of the reflector 150. Accordingly, the surface temperature on the outer surface of the reflector 150 becomes quite low even though the surface temperature on the inner surface of the reflector 150 hardly lowers. Because of this, large difference in surface temperature is inevitable between the inner surface and the outer surface. Hence, there is a risk of producing "a crack" on the reflector 150.

However, each light source 100 according to the present practical example includes the resistor 200, and the resistor 200 is supplied with constant voltage in response to deactivation of lighting of the discharge lamp 110. Hence, the outer surface of the reflector 150 is heated by the heat from the resistor 200. Accordingly, the surface temperature on the outer surface of the reflector 150 gently gets lower. Because of this, it is possible to avoid difference in surface temperature from being enlarged between the inner surface and the outer surface, and also, to minimize a possibility of producing "a crack" on the reflector 150.

(Characteristics of Lighting Device 50)

According to the present practical example, it is possible to provide the light source 100 that includes the discharge lamp 110 and the reflector container 151 and is capable of minimizing a possibility of producing "a crack" on the reflector 150 in activation or deactivation of lighting of the discharge lamp 110, the lighting device 50 including the light source 100, and a method of activating and deactivating lighting of the light source 100.

Modification 1

In the aforementioned practical example 1, the lighting device 50 includes the constant voltage power source 56 and the constant voltage supply control device 57. However, instead of this configuration, the lighting device 50 may include a constant electric current power source 70 and a constant electric current supply control device 72.

The constant electric current power source 70 is a power source for supplying DC constant electric current to the resistor 200 in each light source 100. It should be noted that the constant electric current herein supplied may be AC constant electric current.

Additionally, the constant electric current supply control device 72 is a device for controlling (turning on and off) the supply of constant electric current to the resistor 200 in each light source 100. Similarly to the configuration of the practical example 1, the constant electric current supply control device 72 mainly includes the controller 60 and the timer 62.

Figure 9:
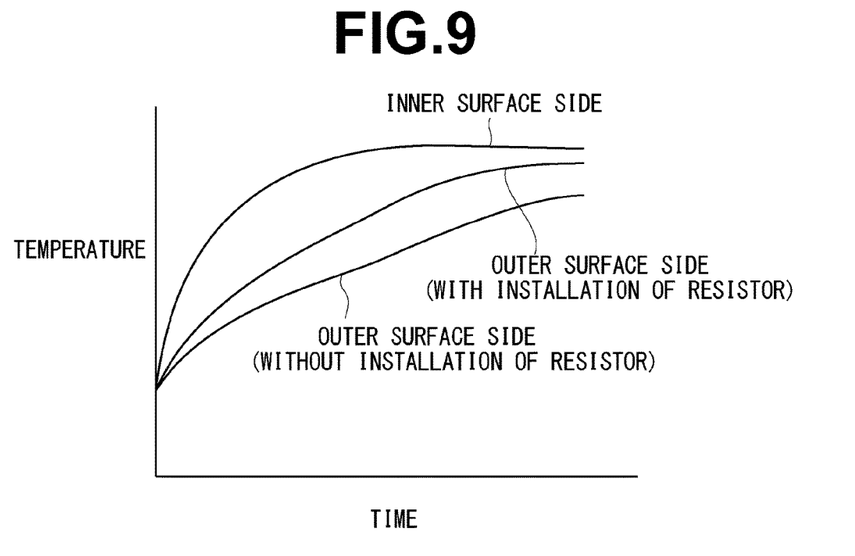
FIG. 9 is a chart showing exemplary behaviors regarding the surface temperature on the inner surface of the reflector (150), that on the outer surface of the reflector (150) with installation of the resistor (200) and that on the outer surface of the reflector (150) without installation of the resistor (200) in a condition where constant current is supplied in activation of lighting of the discharge lamp 110.

The operation of the lighting device 50 in supplying constant electric current to the resistor 200 is also basically the same as the operation of the lighting device 50 in the aforementioned practical example 1. The operation of the constant electric current supply control device 72 results in, as shown in FIG. 9, behaviors regarding the surface temperature on the inner surface of the reflector 150, that on the outer surface of the reflector 150 with installation of the resistor 200, and that on the outer surface of the reflector 150 without installation of the resistor 200.

When constant electric current is supplied to the resistor 200, compared to when constant voltage is supplied thereto, elevation in temperature of the resistor 200 is slower immediately after starting the supply of constant electric current than immediately after starting the supply of constant voltage. However, once the temperature of the resistor 200 starts elevating, the resistance thereof increases, and in accordance, the voltage supplied to the resistor 200 also increases. Increase in resistance of the resistor 200 and increase in voltage supplied to the resistor 200 produce a synergistic effect, and elevation in temperature of the resistor 200 accelerates with elapse of time.

As a result, it is possible to avoid difference in surface temperature from being enlarged between the inner surface and the outer surface of the reflector 150, and also, to minimize a possibility of producing "a crack" on the reflector 150.

Figure 10:
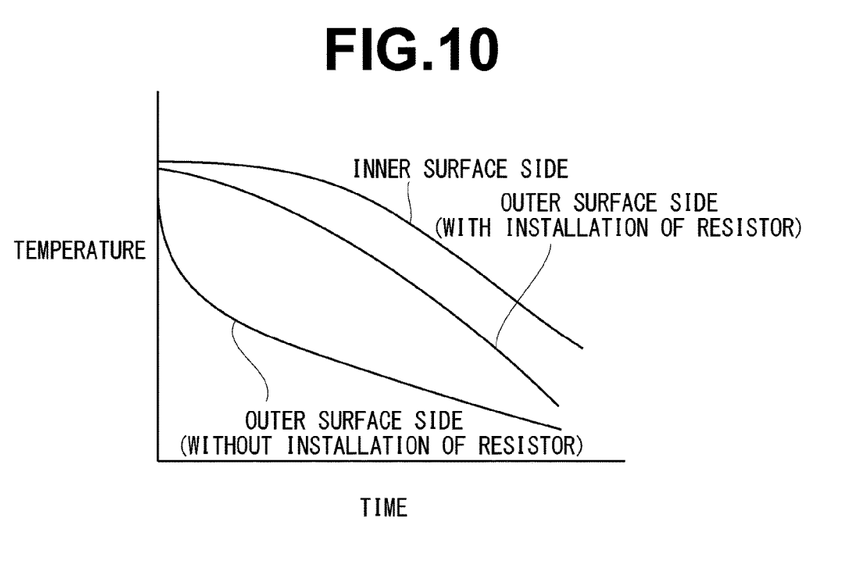
FIG. 10 is a chart showing exemplary behaviors regarding the surface temperature on the inner surface of the reflector (150), that on the outer surface of the reflector (150) with installation of the resistor (200) and that on the outer surface of the reflector (150) without installation of the resistor (200) in a condition where constant current is supplied in deactivation of lighting of the discharge lamp 110.

In deactivation of lighting of the discharge lamp 110, similarly to the practical example 1, the operation of the constant electric current supply control device 72 results in, as shown in FIG. 10, behaviors regarding the surface temperature on the inner surface of the reflector 150, that on the outer surface of the reflector 150 with installation of the resistor 200, and that on the outer surface of the reflector 150 without installation of the resistor 200.

In the phase to deactivate lighting of the discharge lamp 110, the temperature of the resistor 200 will have been highly elevated due to the heat from the discharge lamp 110. Because of this, when constant electric current is supplied to the resistor 200, high voltage is supplied to the resistor 200 immediately after starting the supply of constant electric current. Therefore, the amount of heat irradiated from the resistor 200 is increased. Hence, it is possible to prevent the surface temperature on the outer surface of the reflector 150 from abruptly lowering immediately after deactivation of lighting of the discharge lamp 110. Thus, difference in surface temperature between the inner surface and the outer surface of the reflector 150 can be herein made smaller than in supplying constant voltage to the resistor 200.

As a result, it is possible to avoid difference in surface temperature from being enlarged between the inner surface and the outer surface of the reflector 150, and also, to minimize a possibility of producing "a crack" on the reflector 150.

Modification 2

Furthermore, the lighting device 50 may be provided with not only the constant voltage power source 56 and the constant voltage supply control device 57 but also the constant electric current power source 70 and the constant electric current supply control device 72. As described so far, in the phase to activate lighting of the discharge lamp 110, difference in surface temperature between the inner surface and the outer surface of the reflector 150 can be made smaller in supplying constant voltage to the resistor 200 than in supplying constant electric current to the resistor 200. By contrast, in the phase to deactivate lighting of the discharge lamp 110, difference in surface temperature between the inner surface and the outer surface of the reflector 150 can be made smaller in supplying constant electric current to the resistor 200 than in supplying constant voltage to the resistor 200.

Therefore, by configuring the constant voltage power source 56 and the constant voltage supply control device 57 to operate in the phase to activate lighting of the discharge lamp 110 and by configuring the constant electric current power source 70 and the constant electric current supply control device 72 to operate in the phase to deactivate lighting of the discharge lamp 110, it is possible in the both phases to activate and deactivate lighting of the discharge lamp 110 to avoid difference in surface temperature from being enlarged between the inner surface and the outer surface of the reflector 150 and also to minimize a possibility of producing "a crack" on the reflector 150. Obviously, the constant electric current power source 70 and the constant electric current supply control device 72 may be configured to operate in the phase to activate lighting of the discharge lamp 110, whereas the constant voltage power source 56 and the constant voltage supply control device 57 may be configured to operate in the phase to deactivate lighting of the discharge lamp 110.

Modification 3

In the aforementioned practical example 1, the constant voltage supply control device 57 is configured to operate in both activation and deactivation of lighting of the discharge lamp 110. However, instead of this, the constant voltage supply control device 57 may be configured to operate in only either activation or deactivation of lighting of the discharge lamp 110. Obviously, this configuration may be similarly applied in supplying constant electric current to the resistor 200 as described in the modification 1.

Modification 4

In the aforementioned practical example 1, the controller 60 in the constant voltage supply control device 57 is configured to turn off the switch 55 in response to notification from the timer 62. However, the constant voltage supply control device 57 may be provided with, for instance, a measurement portion instead of the timer 62 so as to measure the temperature on the inner or outer surface of the reflector 150. When detecting that the inner or outer surface of the reflector 150 reaches a predetermined temperature, the measurement portion may notify the controller 60 of this, and in turn, the controller 60 may be configured to turn off the switch 55. Obviously, this configuration may be similarly applied in supplying constant electric current to the resistor 200 as described in the modification 1.

Modification 5

Figure 11:
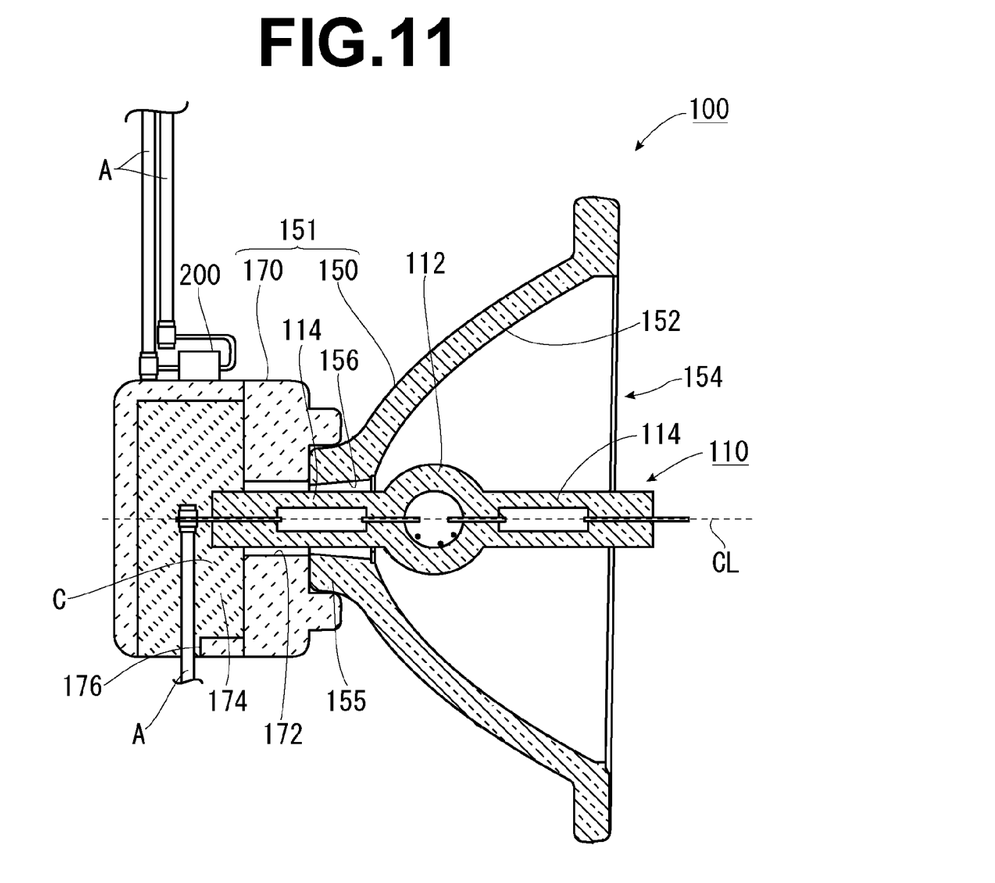
FIG. 11 is a cross-sectional view of another practical example regarding a position in which the resistor (200) is arranged and installed.
Figure 12:
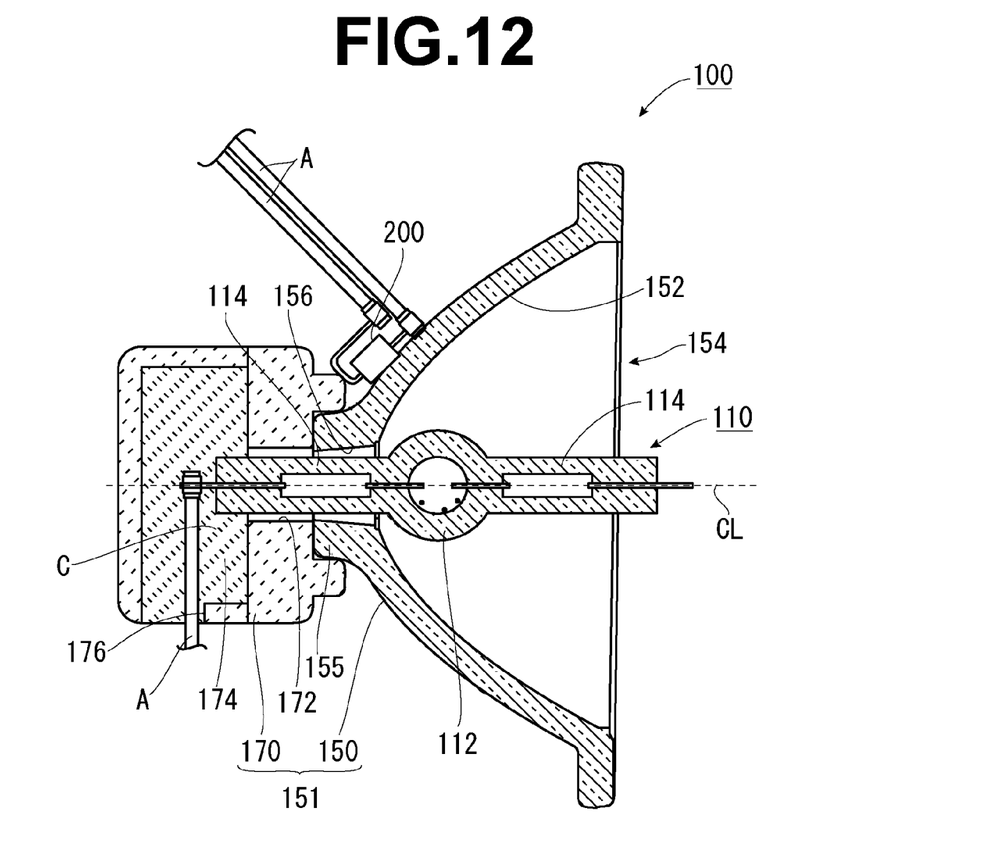
FIG. 12 is a cross-sectional view of yet another practical example regarding a position in which the resistor (200) is arranged and installed.

In the aforementioned practical example and modifications, the resistor 200 is accommodated in the reflector container 151. However, the position in which the resistor 200 is arranged and installed is not limited to this. For example, the resistor 200 may be arranged and installed in a position laterally outside the reflector container 151 (FIG. 11), or alternatively, may be arranged and installed in a position outside (on the rear surface side of) the reflector 150 (FIG. 12). In this case, it is also preferable and suitable, as described above, for the resistor 200 to be attached to the position located on the upper side in use of the lighting device 50 to which each light source 100 is attached.

Although the invention has been described in its preferred form with a certain degree of particularity, it is understood that the present disclosure of the preferred form has been changed in the details of construction and the combination and arrangement of parts may be resorted to without departing from the spirit and scope of the invention as hereinafter claimed.

The disclosure of Japanese Patent Application No. 2017-174413 filed on Sep. 11, 2017 including specifications, drawings and claims are incorporated herein by reference in its entirely.

What is claimed is:

1. A light source comprising:
    a reflector comprising a first side, a second side opposite the first side, a reflective surface on the first side, and a second surface on the second side;
    a discharge lamp comprising a luminous portion adapted to produce light, the luminous portion being disposed on the first side of the reflector;
    a resistor disposed on the second side of the reflector, the resistor having a resistance and a temperature, wherein the resistance of the resistor increases in response to an increase in the temperature and decreases in response to a decrease in the temperature, the resistor being adapted to heat the second surface, wherein
    the reflector is disposed between the luminous portion of the discharge lamp and the resistor.

2. The light source of claim 1, wherein:
    the resistor heats the second side of the reflector during a reduction of a second temperature of the discharge lamp during a deactivation phase of the discharge lamp.

3. The light source according to claim 1, wherein the discharge lamp mainly irradiates an ultraviolet light, and the reflector surface reflects the ultraviolet light irradiated from the discharge lamp.

4. The light source according to claim 1, further comprising an insulating base disposed on the second side of the reflector, and wherein the resistor is disposed in the insulating base.

5. A lighting device comprising:
    at least one light source of claim 1; and
    a constant voltage power source adapted to supply constant voltage to the resistor.

6. A lighting device comprising:
    at least one light source of claim 1; and
    a constant electric current power source adapted to supply constant electric current to the resistor.

7. A lighting device comprising:
    at least one light source of claim 1;
    a constant voltage power source adapted to supply constant voltage to the resistor during an activation phase of the discharge lamp; and
    a constant electric current power source adapted to supply constant electric current to the resistor during a deactivation phase of the discharge lamp.

8. A method of lighting a light source, the method comprising:
    supplying constant voltage to the resistor of the light source of claim 2 for a predetermined of time after deactivation of the discharge lamp.

9. A method of lighting a light source, the method comprising:
    supplying constant electric current to the resistor of the light source of claim 2 for a predetermined period of time after deactivation of the discharge lamp.

10. A method of lighting a light source, the method comprising:
    supplying constant voltage to the resistor of the light source of claim 1 for a first predetermined period of time after activation f lighting of the discharge lamp; and
    supplying constant electric current to the resistor for a second predetermined period of time after deactivation of the discharge lamp.

11. A lighting device comprising:
    at least one light source of claim 2; and
    a constant voltage power source adapted to supply constant voltage to the resistor.

12. A lighting device comprising:
    at least one light source of claim 2; and
    a constant electric current power source adapted to supply constant electric current to the resistor.

13. A lighting device comprising:
    at least one light source of claim 2;
    a constant voltage power source adapted to supply constant voltage to the resistor during activation of the discharge lamp; and
    a constant electric current power source adapted to supply constant electric current to the resistor during deactivation of the discharge lamp.

14. A method of lighting a light source, the method comprising:
    supplying constant voltage to the resistor of the light source of claim 2 for a predetermined period of time after activation of the discharge lamp.

15. A method of lighting a light source, the method comprising:
    supplying constant electric current to the resistor of the light source of claim 2 for a predetermined period of time after activation of the discharge lamp.

16. A method of lighting a light source, the method comprising:
    supplying constant voltage to the resistor of the light source of claim 2 for a first predetermined period of time after activation of the discharge lamp; and
    supplying constant electric current to the resistor for a second predetermined period of time after deactivation of the discharge lamp in the light source.

17. The light source of claim 1, wherein:
    the resistor heats the second surface of the reflector during an increase of a second temperature of the discharge lamp during an activation phase of the discharge lamp.

18. The light source according to claim 1, further comprising an insulating base disposed on the second side of the reflector, and wherein the resistor directly contacts an outer surface of the insulator base.

19. The lighting source according to claim 1, wherein the resistor directly contacts the second side of the reflector.

20. A method of lighting a light source, the method comprising:
    supplying constant voltage to the resistor of the light source of claim 17 for a predetermined period of time after activation of the discharge lamp.

21. A method of lighting a light source, the method comprising:
    supplying a constant electric current to the resistor of the light source of claim 17 for a predetermined period of time after activation f lighting of the discharge lamp.

* * * * *